United States Patent
Park et al.

(10) Patent No.: US 6,833,603 B1
(45) Date of Patent: Dec. 21, 2004

(54) DYNAMICALLY PATTERNED SHIELDED HIGH-Q INDUCTOR

(75) Inventors: Jae-Eun Park, Wappingers Falls, NY (US); Robert A. Groves, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,696

(22) Filed: Aug. 11, 2003

(51) Int. Cl.[7] .............................................. H01L 29/00
(52) U.S. Cl. ...................................... 257/528; 257/531
(58) Field of Search ................................ 257/528, 531; 438/329, 381

(56) References Cited

U.S. PATENT DOCUMENTS

| 5,151,775 | A | 9/1992 | Hadwin |
| 5,760,456 | A | 6/1998 | Grzegorek et al. |
| 6,310,387 | B1 | 10/2001 | Seefeldt et al. |
| 6,593,838 | B2 * | 7/2003 | Yue .......................... 336/84 C |
| 2002/0074620 | A1 | 6/2002 | Yue | |

FOREIGN PATENT DOCUMENTS

| EP | 0536972 B1 | 4/1993 |
| JP | 10208940 A | 8/1998 |
| WO | WO 02/49110 A1 | 6/2002 |
| WO | WO 02/50848 A2 | 6/2002 |

OTHER PUBLICATIONS

"On–Chip Spiral Inductors For Silicon–Based Radio–Frequency Integrated Circuits", A Dissertation, by Chik Patrick Yue, Jul. 1998.

* cited by examiner

Primary Examiner—Thien F Tran
(74) Attorney, Agent, or Firm—Scully, Scott, Murphy & Presser; Joseph P. Abate, Esq.

(57) ABSTRACT

High quality factor (Q) inductor elements with dynamically driven, conductive, patterned shields are disclosed wherein a conductive, patterned shield structure/layer is provided between the inductor element and the substrate. The patterned shield is dynamically driven to the same electrical potential as the inductor element, to reduce or eliminate parasitic capacitive coupling between the inductor element and the conductive substrate. The patterned shield is patterned to form a plurality of conductive segments which are insulated from each other such that eddy currents cannot flow from one conductive segment to an adjacent conductive segment, to prevent the flow of eddy currents in the patterned shield when it is dynamically driven to the same electrical potential as the inductor element. The conductive segments of the patterned shield are electrically connected together at a central connecting point to allow the patterned shield to be dynamically driven to the same electrical potential as the inductor element.

20 Claims, 2 Drawing Sheets

DYNAMICALLY PATTERNED SHIELDED HIGH-Q INDUCTOR

BACKGROUND OF INVENTION

The present invention relates generally to high quality factor (Q) BEOL (back end of line) inductor elements with dynamically driven, patterned, conductive shields which reduce or eliminate parasitic substrate capacitive coupling between the inductor and the conductive.

Prior art implementations for BEOL inductor elements have utilized a buffered drive of adjacent spiral inductive elements to achieve a higher quality factor (Q), and have required complicated processing or many additional accessory functional elements, such as a variable attenuator and a variable phase shifter. These prior art implementations of shielded inductors have attempted to achieve a higher Q by increasing the magnetic flux coupling of the inductor (Yeung, et. al., "Design Considerations for extremely High Q Integrated Inductors and Their Application in CMOS RF Power Amplifier", IEEE Proceedings, RAWCON, 1998).

Other prior art implementations have utilized a grounded, low impedance, patterned, conductive shield underneath the inductor to intercept the parasitic capacitive coupling between the inductor and the conductive substrate. These implementations achieve higher Q through reduction of the power loss in the conductive substrate. The capacitively coupled current that would normally flow through the conductive substrate (causing power loss and Q reduction) is shunted through a very low impedance directly to a ground potential (reducing the power loss). An example of this approach can be seen in International Patent WO 02/50848 A2, by Wu. The shield in these implementations is patterned in such a way as to reduce or eliminate the magnetically induced eddy currents that would normally flow in a shield that consisted of a large plate of conductive material. These eddy currents would reduce the net magnetic field of the inductor, reducing Q and inductance, negating any beneficial effects of the shield.

SUMMARY OF INVENTION

The present invention provides high Q BEOL inductor elements with dynamically driven, patterned, conductive shields. A patterned, conductive shield structure/layer is provided between the inductor element and the substrate, and the patterned shield layer is dynamically driven to the same electrical potential as the inductor element itself, to reduce or eliminate parasitic substrate capacitive coupling between the BEOL inductor element and the conductive substrate.

The shield layer is patterned to form a plurality of conductive segments which are selectively insulated from each other such that eddy currents cannot flow from one conductive segment to an adjacent conductive segment, to prevent the flow of eddy currents in the patterned shield structure when it is dynamically driven to the same electrical potential as the BEOL upper inductor element. The conductive segments are generally formed and designed to extend from the edges of the shield layer towards the center of the shield layer and the spiral inductor element, and are electrically connected together to be dynamically driven to the same electrical potential as the BEOL inductor element.

In one disclosed embodiment, the spiral inductor element is designed with a series of linear conductor segments separated by substantially 90 degree angular bends, to form a square or rectangular shape spiral, such that the series of linear conductor segments and angular bends enable the inductor element to spiral within itself and terminate in an inner end near the center of the convoluted spiral inductor element. A square or rectangular shaped patterned, conductive shield structure is formed below the spiral inductor element, between the spiral inductor element and the substrate, and is larger in area with a greater length and greater width than the spiral inductor element, such that it extends beyond the outer lateral edges of the spiral inductor element to shield the inductor element from the substrate. The patterned shield typically extends beyond the outer lateral edges of the inductor element by a distance roughly equal to, or greater than, the dielectric stack height separating the inductor element and the patterned shield.

In another disclosed embodiment, the spiral inductor element is designed with a series of linear conductor segments separated by substantially 45 degree angular bends, to form a polygon octagonal shape spiral, such that the series of linear conductor segments and angular bends enable the inductor element to spiral within itself and terminate in an inner end near the center of the convoluted spiral inductor element. A patterned, conductive shield structure is formed below the spiral inductor element, between the spiral inductor element and the substrate, and is larger in area than the area of the spiral inductor element, such that it extends beyond the outer lateral edges of the spiral inductor element to shield the inductor element from the substrate. The patterned shield typically extends beyond the outer lateral edges of the inductor element by a distance roughly equal to, or greater than, the dielectric stack height separating the inductor element and the patterned shield.

The reduction or elimination of the parasitic capacitive components provides high Q inductor elements and components. The inductor elements can achieve at least a 100% increase in peak quality factor Q using the dynamically driven patterned, conductive shield structures of the present invention.

BRIEF DESCRIPTION OF DRAWINGS

The foregoing objects and advantages of the present invention for a high-Q inductor with a dynamically patterned shield may be more readily understood by one skilled in the art with reference being made to the following detailed description of several embodiments thereof, taken in conjunction with the accompanying drawings wherein like elements are designated by identical reference numerals throughout the several views, and in which.

DETAILED DESCRIPTION

Figure 1:
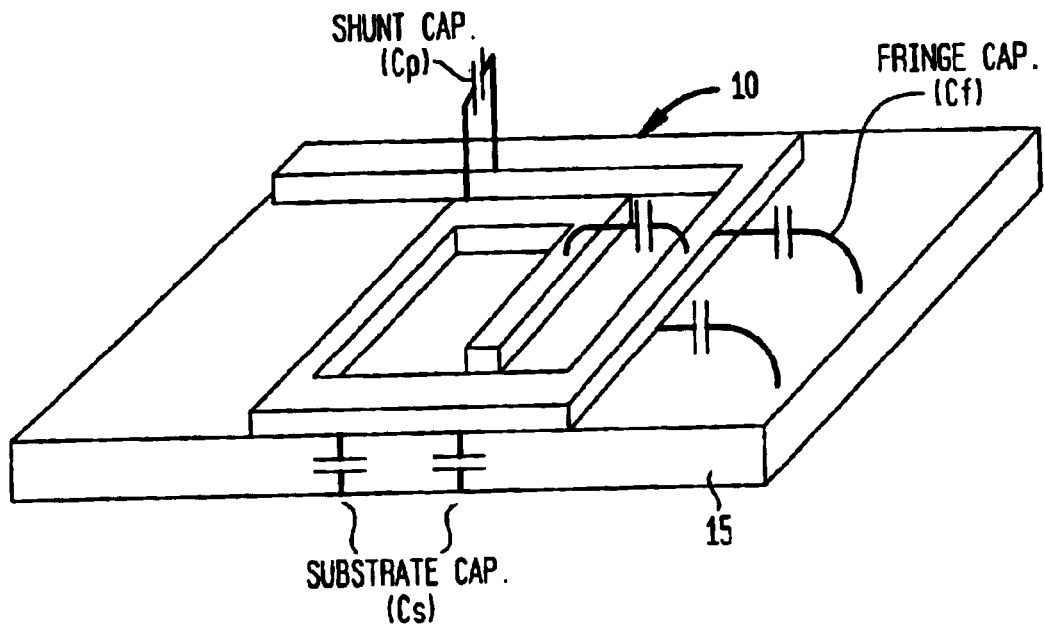
FIG. 1 illustrates a conventional prior art spiral type of upper inductor element realized in the BEOL (Back End Of Line) processing of monolithic integrated circuits.

FIG. 1 illustrates a conventional prior art spiral type of inductor element 10 realized in the BEOL (Back End Of Line) processing of monolithic integrated circuits. Such conventional prior art inductor elements suffer from excessive power losses due to:

1) parasitic substrate capacitive coupling Cs between the inductor device 10 and the conductive substrate 15;

2) parasitic fringe capacitance coupling Cf between the inductor device 10 and the conductive substrate 15; and 3) parasitic shunt capacitance coupling Cp between different adjacent shunt sections of the inductor element 10.

These excessive power losses make it difficult to achieve System On Chip (SOC) applications due to the relatively low Q of the integrated passive inductor components.

Figure 2:
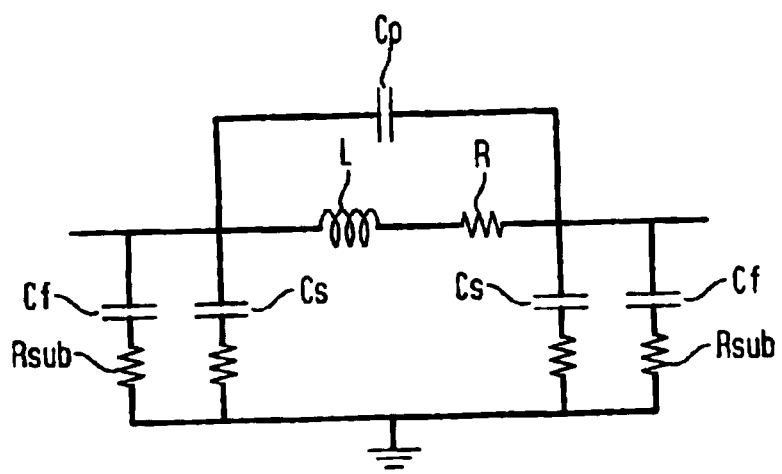
FIG. 2 illustrates an equivalent circuit for the conventional prior art BEOL upper inductor element of FIG. 1.

FIG. 2 illustrates an equivalent circuit for a conventional prior art spiral type of inductor element. The inductor element is illustrated as having an equivalent inductive component L and a resistive component R, with a parasitic substrate capacitive coupling Cs illustrated at each end of the equivalent inductance L and resistance R which is coupled through a resistance Rsub to ground. The inductor element is also illustrated with a parasitic fringe capacitance Cf at each end of the equivalent inductance L and resistance R coupled through a resistance Rsub to ground, and a parasitic shunt capacitance Cp coupling each end of the equivalent inductive component L and resistive component R.

The present invention provides high Q inductor elements with dynamically driven, patterned, conductive shields. A patterned shield layer is provided between the inductor element and the substrate, and the patterned shield layer is dynamically driven to the same potential as the inductor element itself to reduce or eliminate parasitic capacitive coupling between the inductor element and the conductive substrate.

By dynamically driving a patterned, conductive shield layer under an inductor device to the same electrical potential as the inductor device itself, the inductor device's parasitic coupling to the substrate can be dramatically reduced or eliminated. This results in very high Q passive inductor components. Inductor elements can achieve at least a 100% increase in peak quality factor Q using this technical approach.

The patterning of the shield layer is required in order to reduce or eliminate the flow of magnetically induced eddy currents that would be seen in a non-patterned shield plate. The shield layer is patterned to form a plurality of conductive segments which are selectively insulated from each other such that eddy currents cannot flow from one conductive segment to an adjacent conductive segment. The conductive segments are generally formed and designed to extend from the outer lateral edges of the shield layer towards the centers of the shield layer and the spiral inductor element. Additionally, the conductive segments are patterned in such a way that they are all electrically connected together at a central connection to enable the buffer element to drive all of the shield conductive segments to a common potential.

Figure 3:
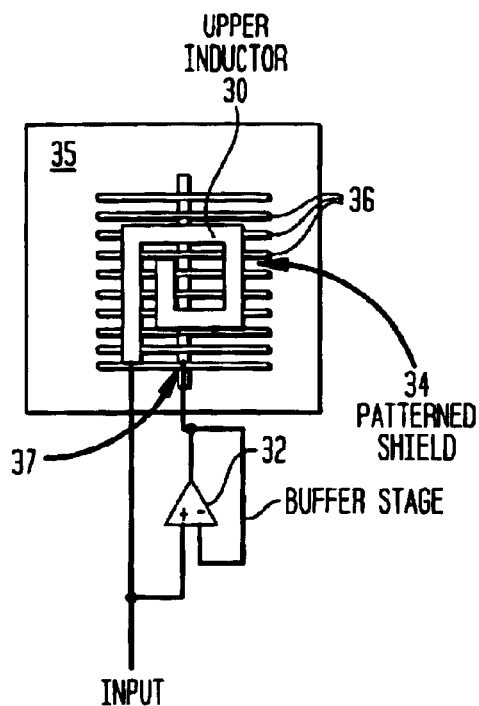
FIGS. 3 and 4 are respectively a top plan view and a vertical sectional view of a first embodiment of the present invention wherein a conventional BEOL square or rectangular shaped spiral inductor element is fabricated with an additional buffer element and with a dynamically driven, square or rectangular shaped patterned, conductive shield structure formed between the spiral inductor element and the substrate, which is larger in area with a greater length and greater width than the spiral inductor element.
Figure 4:
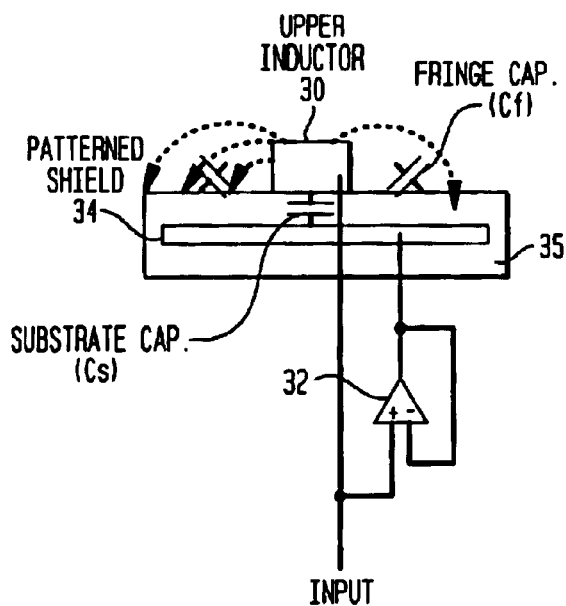

FIGS. 3 and 4 are respectively a top plan view and a vertical sectional view of a first embodiment of the present invention in which a conventional inductor element 30 is fabricated with an additional buffer element 32 and with a dynamically driven, conductive, patterned bottom shield element 34. The bottom shield element 34 is well patterned in order to capture the parasitic electric field, which entails a fringe capacitance (Cf) and a substrate capacitance (Cs), but does not generate eddy currents.

The inductor shield element 34 is patterned to form a shield element which is geometrically larger than the size of the inductor element to guarantee the elimination of the fringe capacitances. The patterned shield typically extends beyond the outer lateral edges of the inductor element by a distance roughly equal to, or greater than, the dielectric stack height separating the inductor element and the patterned shield. The shield element is patterned in order not to generate eddy currents, which reduce the inductance of the inductor element and result in a reduced quality factor Q. If the shield layer is geometrically equal to the size of the inductor as described in the U.S. Pat. No. 5,151,775, fringe capacitances still exist and result in energy dissipation and a reduced Q.

Pursuant to the present invention, a buffered electrical signal is applied by the additional buffer element 32 to the patterned, conductive shield element 34, through a central connection 37, that is in phase with the electrical signal applied to the inductor element 10. The buffer circuit can be easily constructed using any circuit which provides a high input impedance and unity gain, such as a simple emitter follower or source follower circuit.

Since the electrical signal applied to the patterned shield element is synchronized in phase with the electrical signal applied to the inductor element, any parasitic capacitive coupling of the inductor element 10 to the substrate 35 is electrically eliminated.

Since any capacitive path to the resistance of the substrate Rsub is eliminated, there is no power loss in the substrate. Therefore a higher Q, at least 100% higher, can be achieved compared to conventional prior art inductor elements.

Referring to FIGS. 3 and 4, the spiral inductor element 30 is designed with a series of linear conductor segments separated by substantially 90 degree angular bends, to form a square or rectangular spiral, such that the series of linear conductor segments and angular bends enable the inductor element to spiral within itself and terminate in an inner end near the center of the convoluted spiral inductor element.

A square or rectangular shaped patterned, conductive shield structure 34 is formed below the convoluted spiral inductor element 30, between the spiral inductor element 30 and the substrate 35, and is larger in area, with a greater length and width, than the spiral inductor element, such that it extends beyond the outer lateral edges of the spiral inductor element to shield the inductor element from the substrate. The square or rectangular shaped conductive shield layer is positioned centrally below the spiral inductor element, and is selectively patterned into conducting segments 36 and non-conducting segments. The conducting segments 36 extend from the outer edge of the shield layer toward the center and are connected together by a central conductor element 37. The conducting segments 36 are patterned in such a way that eddy currents cannot flow from one conductive segment to another conductive segment. Additionally, the patterning of the conductive shield segments is such that the shield elements are all electrically connected together through the central conductor element 37.

Figure 5:
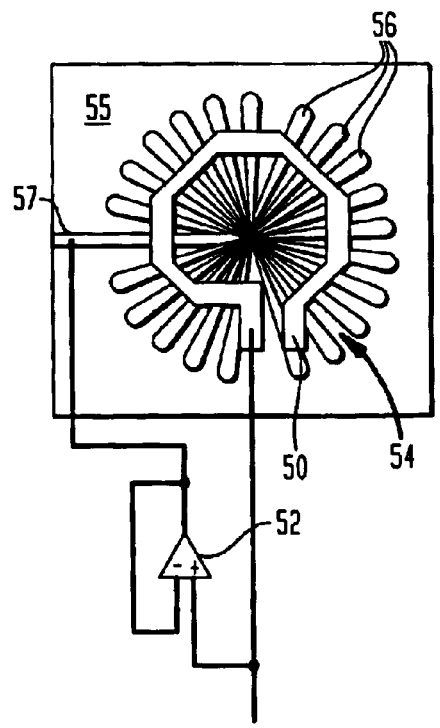
FIG. 5 is a top plan view of another embodiment of the present invention wherein a conventional BEOL octagonal shaped spiral inductor element is fabricated with an additional buffer element and with a dynamically driven patterned, conductive shield structure formed between the spiral inductor element and the substrate, which is larger in area than the spiral inductor element

FIG. 5 shows a top planar view of another embodiment of the present invention wherein a spiral inductor element 50 is designed with a series of linear conductor segments separated by substantially 45 degree angular bends, such that the series of linear conductor segments and angular bends enable the inductor element to spiral within itself and terminate in an inner end near the center of the convoluted spiral inductor element.

A polygon octagonal shaped patterned, conductive shield structure 54 is formed below the convoluted spiral inductor element 50, between the spiral inductor element and the substrate 55, and is larger in area than the area of the spiral inductor element 50, such that it extends beyond the outer lateral edges of the spiral inductor element to shield the inductor element from the substrate.

Pursuant to the present invention, a buffered electrical signal is applied by the additional buffer element 52 to the patterned, conductive shield element 54, through a central connector 57 that connects centrally to all of the conducting segments 56 of the conductive shield element 54, that is in phase with the electrical signal applied to the inductor element. The buffer circuit can be easily constructed using any circuit which provides a high input impedance and unity gain, such as a simple emitter follower or source follower circuit.

In this embodiment, the polygon octagonal shaped shield layer 54 is positioned centrally below the spiral inductor element, and is selectively patterned into conducting segments 56 and non-conducting segments. The conducting segments 56 extend radially from the outer lateral edges of the shield layer toward the center and are connected together and to the central connector 57 at a central connecting point. The conducting segments 56 are patterned in such a way that eddy currents cannot flow from one conductive segment to another conductive segment. Additionally, the patterning of the conductive shield segments is such that the shield segments are all electrically connected together and to the central connector 57 at the central connecting point.

The reduction or elimination of the parasitic capacitive components provides high Q inductor elements and components. The inductor elements can achieve at least a 100% increase in peak quality factor Q using the dynamically driven patterned shield structures of the present invention.

In alternative embodiments not specifically illustrated herein, the spiral inductor element can be designed with a series of linear conductor segments separated by any chosen angular degree bends, such that the series of linear conductor segments and angular bends enable the inductor element to spiral within itself and terminate in an inner end near the center of the convoluted spiral inductor element. The spiral inductor element would be fabricated with an additional buffer element, and a conductive, patterned shield structure would be formed below the convoluted spiral inductor element, between the spiral inductor element and the substrate, and would be larger in area than and extend beyond the outer lateral edges of the spiral inductor element to shield the inductor element from the substrate.

High Q inductor elements can provide increased selectively for band pass filters (BPFs), low phase noise in voltage controlled oscillators (VCOs), a low noise figure for low noise amplifiers (LNAs), and significant improvements in a large number of different diverse electrical circuits.

The technical approach of the present invention improves and enhances the Q of inductor elements by decoupling the inductor elements from their surroundings through the addition of a few active components that are readily available and can be easily fabricated in an integrated CMOS (complementary metal oxide semiconductor) process or a bicmos process.

While several embodiments and variations of the present invention for a dynamically patterned shielded high-Q inductor are described in detail herein, it should be apparent that the disclosure and teachings of the present invention will suggest many alternative designs to those skilled in the art.

What is claimed is:

1. A high quality factor (Q) BEOL (back end of line) inductor element with a dynamically driven, patterned shield comprising:
   a BEOL inductor element fabricated spaced from a conductive substrate;
   a patterned conductive shield structure provided between the BEOL inductor element and the conductive substrate, wherein the patterned shield structure is dynamically driven to the same electrical potential as the BEOL inductor element, to reduce or eliminate parasitic capacitive coupling between the BEOL inductor element and the conductive substrate, and wherein the patterned shield structure is patterned to form a plurality of conductive segments which are selectively insulated from each other, such that eddy currents cannot flow from one conductive segment to an adjacent conductive segment, to prevent the flow of eddy currents in the patterned shield structure, and wherein the conductive segments are electrically connected together to be dynamically driven to the same electrical potential as the BEOL inductor element.

2. The BEOL inductor element of claim 1, wherein the BEOL inductor element is fabricated with an additional buffer element which dynamically drives the patterned shield structure to the same electrical potential as the BEOL inductor element.

3. The BEOL inductor element of claim 2, wherein the buffer element comprises a high input impedance unity gain circuit.

4. The BEOL inductor element of claim 3, wherein the high input impedance unity gain circuit comprises an emitter or source follower circuit.

5. The BEOL inductor element of claim 1, wherein the patterned shield structure is geometrically larger than the BEOL inductor element.

6. The BEOL inductor element of claim 5, wherein the patterned shield structure extends beyond outer lateral edges of the BEOL inductor element by a distance equal to or greater than a distance separating the BEOL inductor element and the patterned shield structure.

7. The BEOL inductor element of claim 1, wherein the BEOL inductor element comprises a square or rectangular shaped spiral BEOL inductor element, and the patterned shield structure comprises a square or rectangular shaped shield structure which is geometrically larger, having a larger length and a larger width than the square or rectangular shaped spiral BEOL inductor element.

8. The BEOL inductor element of claim 7, wherein the patterned shield structure extends beyond outer lateral edges of the BEOL inductor element by a distance equal to or greater than a distance separating the BEOL inductor element and the patterned shield structure.

9. The BEOL inductor element of claim 7, wherein the patterned shield structure is selectively patterned into conductive segments and non-conductive segments and the conductive segments extend from outer lateral edges of the patterned shield layer toward a center of the patterned shield layer to form a plurality of individual conductive segments which are insulated from each other such that eddy currents cannot flow from one conductive segment to another conductive segment.

10. The BEOL inductor element of claim 9, wherein the conductive segments are connected together by a central conducting element which electrically connects the conductive segments together.

11. The BEOL inductor element of claim 1, wherein the BEOL inductor element comprises a BEOL spiral octagonal shaped inductor element having a series of linear conductor segments separated by substantially 45 degree angular bends, such that the series of linear conductor segments and angular bends enable the inductor element to convolute within itself and terminate in an inner end near a center of the convoluted spiral inductor element.

12. The BEOL inductor element of claim 11, wherein the patterned shield structure is larger in area than the area of the BEOL spiral inductor element and extends beyond outer lateral edges of the BEOL spiral inductor element to shield the BEOL inductor element from the conductive substrate.

13. The BEOL inductor element of claim 12, wherein the patterned shield structure extends beyond the outer lateral edges of the BEOL inductor element by a distance equal to or greater than a distance separating the BEOL inductor element and the patterned shield structure.

14. The BEOL inductor element of claim 12, wherein the patterned shield structure is patterned into conductive segments and non-conductive segments and the conductive segments extend radially from the outer lateral edges of the patterned shield structure toward the center of the patterned shield structure to form a plurality of individual conductive segments which are insulated from each other such that eddy currents cannot flow from one conductive segment to another conductive segment.

15. The BEOL inductor element of claim 14, wherein the conductive segments are electrically connected together at a central connecting point to enable the patterned shield structure to be dynamically driven to the same electrical potential as the BEOL inductor element.

16. The BEOL inductor element of claim 1, wherein the BEOL inductor element comprises a BEOL spiral polygon shaped inductor element having a series of linear conductor segments separated by angular bends, such that the series of linear conductor segments and angular bends enable the inductor element to convolute within itself and terminate in an inner end near a center of the convoluted spiral inductor element.

17. The BEOL inductor element of claim 16, wherein the patterned shield structure is larger in area than the area of the BEOL spiral inductor element and extends beyond outer lateral edges of the BEOL spiral inductor element to shield the BEOL inductor element from the conductive substrate.

18. The BEOL inductor element of claim 17, wherein the patterned shield structure extends beyond the lateral edges of the BEOL inductor element by a distance equal to or greater than a distance separating the BEOL inductor element and the patterned shield structure.

19. The BEOL inductor element of claim 18, wherein the patterned shield structure is patterned into conductive segments and non-conductive segments and the conductive segments extend radially from the outer lateral edges of the patterned shield structure toward a center of the patterned shield structure to form a plurality of individual conductive segments which are insulated from each other such that eddy currents cannot flow from one conductive segment to another conductive segment.

20. The BEOL inductor element of claim 19, wherein the conductive segments are electrically connected together at a central connecting point on the patterned shield structure to enable the patterned shield structure to be dynamically driven to the same electrical potential as the BEOL inductor element.

* * * * *